United States Patent [19]

Bluzer

[11] 4,166,223

[45] Aug. 28, 1979

[54] DUAL FIELD EFFECT TRANSISTOR STRUCTURE FOR COMPENSATING EFFECTS OF THRESHOLD VOLTAGE

[75] Inventor: Nathan Bluzer, Silver Spring, Md.

[73] Assignee: Westinghouse Electric Corp., Pittsburgh, Pa.

[21] Appl. No.: 875,715

[22] Filed: Feb. 6, 1978

[51] Int. Cl.² .................... G11C 19/28; H01L 29/78; H01L 29/80

[52] U.S. Cl. ................................. 307/221 D; 357/22; 357/23; 357/24

[58] Field of Search ........................... 357/22, 23, 24; 307/221 D

[56] References Cited

U.S. PATENT DOCUMENTS

| | | | |
|---|---|---|---|
| 3,283,221 | 11/1966 | Heiman | 357/23 |
| 3,639,813 | 2/1972 | Kamoshida et al. | 357/22 |
| 3,896,483 | 7/1975 | Whelan | 357/22 |
| 3,918,070 | 11/1975 | Shannon | 357/24 |
| 4,000,504 | 5/1975 | Berger | 357/23 |

FOREIGN PATENT DOCUMENTS 7606746 12/1976 Netherlands ............................... 357/24

Primary Examiner—William D. Larkins
Assistant Examiner—Gene M. Munson
Attorney, Agent, or Firm—W. E. Zitelli

[57] ABSTRACT

A dual field effect transistor structure for reducing the effects of threshold voltage of one of the field effect transistors as reflected to a signal source device which is coupled thereto is disclosed. More specifically, a p-channel enhancement mode field effect transistor having a surface conduction channel and an n-channel depletion mode field effect transistor having a buried conduction channel are formed in a semiconductor structure such that both transistors have a common gate. A voltage potential is applied to the common gate to affect the first and second depletion regions in the semiconductor structure respectively associated with the enhancement mode and depletion mode transistors to render a quiescent threshold voltage of the enhancement mode transistor which is reflected to the measuring device. The semiconductor structure is initially electrically biased in conjunction with the voltage potential applied to the common gate to cause the first and second depletion regions to pinch off the buried conduction channel substantially eliminating current flow therethrough. The signal source device may be coupled to the source of the enhancement mode transistor to conduct a first current through the surface conduction channel. This first current screens the electric field lines which are produced by the voltage potential applied to the gate to cause a modulation of the first depletion region. This modulation effects a second current in the buried conduction channel of the depletion mode transistor. A resistor network which is coupled between the drain of the depletion mode transistor and the common gate is utilized to detect the second current and accordingly control the value of the gate voltage potential in a sense which causes the first and second depletion regions to substantially pinch off the buried conduction channel or reduce the second current being conducted therethrough. In this manner, the gate voltage potential is adjusted to substantially maintain the quiscent threshold voltage.

27 Claims, 7 Drawing Figures

DUAL FIELD EFFECT TRANSISTOR STRUCTURE FOR COMPENSATING EFFECTS OF THRESHOLD VOLTAGE

BACKGROUND OF THE INVENTION

This invention relates in general to the field of integrated circuit field effect transistors and the effects of threshold associated therewith as reflected to an electrical signal source coupled thereto and more particularly, to a dual field effect transistor structure which reduces the effects of these threshold voltages on the electrical signal sources coupled thereto.

Charge coupled devices (CCD's) are presently being used, in some cases, to provide memory storage arrays for digital or analog information derived from a corresponding array of measuring detectors. In the field of infrared (IR) imaging, for example, wherein photodetectors are used as the measuring detectors, it is generally desirable to have injection type structures fabricated at the inputs of the CCD arrays to couple the information measured from the IR photodetectors to the CCD arrays which provide storage of the time dependent photo images formed. However, many of these conventional injection type structures are comprised of a metal oxide semiconductor (MOS) field effect transistor (FET) which exhibit variations in their threshold voltages between inputs. The threshold voltages of the injection type CCD inputs depend on several parameters which are nonuniform across a given Si wafer of CCD's and are generally affected by integrated circuit (IC) fabrication processes. Larger variation of the threshold voltages are expected between CCD injection type inputs on different wafers as compared to CCD inputs on the same wafer. It appears that variation of parameters upon which the threshold voltage ($V_T$) is dependent increases over larger areas. Examples of the magnitude of threshold variations between different conventional detector/CCD inputs as measured experimentally on several CCD coupling structures are illustrated in Table 1. The offset voltage variations, for the best CCD in Table 1 is ±42 mV about the mean threshold voltage. The offset voltage between injection diffusion inputs fabricated on different wafers is larger (~250 mV) than the offset variations of inputs fabricated on the same wafer.

In the cases when the measuring detectors are current sources, such as back-biased photodiodes, for example, the voltage potential applied across the current source must be at least at a minimum value to render the current source operable across its measuring spectrum. For economy, the photodiodes are normally back-biased by a common voltage source. Under these conditions, the threshold voltage variations of conventional MOSFET injection type input structures make it difficult to adjust the common back-biasing voltage source at a mean value to assure proper operability of all the current source measuring detectors. In addition, these threshold variations may also affect certain operating performance characteristics of the measuring detectors, such as impedance, noise and signal level, for example. Therefore, it appears that before direct injection becomes a viable coupling scheme, the effects of the threshold voltage variations on the detector's operation should cause no degradation to its performance.

TABLE I

| Injection Input No. (Same Wafer) | CCD NUMBER (different wafers) | | | | | | | |
|---|---|---|---|---|---|---|---|---|
| | 2 | 3 | 5 | 10 | 14 | 15 | 20 | 21 |
| 20 | −42 | 30 | −54 | 6 | 21 | −132 | −12 | 42 |
| 19 | 42 | −21 | −120 | −48 | −30 | −87 | −15 | 24 |
| 18 | −75 | 0 | −80 | −39 | −60 | −117 | 12 | 18 |
| 17 | −69 | −21 | −78 | −54 | −78 | −144 | −42 | 24 |
| 16 | −72 | −30 | −63 | −81 | −78 | −126 | −51 | −21 |
| 15 | −84 | −39 | −93 | −84 | −81 | −117 | −51 | −39 |
| 14 | −54 | −39 | −63 | * | −78 | −96 | −48 | −21 |
| 13 | −42 | −6 | −54 | * | −24 | −93 | −51 | −21 |
| 12 | −45 | −24 | −84 | −78 | −63 | −120 | −51 | −30 |
| 11 | −75 | −9 | −42 | −36 | −57 | −96 | −60 | 18 |
| 10 | −33 | −24 | −24 | −33 | −6 | −99 | −60 | 15 |
| 9 | −15 | 48 | −9 | −24 | 0 | −87 | −72 | 51 |
| 8 | −3 | 39 | −42 | −15 | −18 | −93 | −63 | 48 |
| 7 | * | 27 | −33 | −6 | −57 | −60 | −42 | 30 |
| 6 | −39 | 9 | −15 | 6 | −36 | −90 | −33 | 9 |
| 5 | −12 | −72 | −6 | −18 | −42 | −54 | −30 | 24 |
| 4 | −3 | 0 | 12 | −12 | −27 | 6 | −21 | 42 |
| 3 | 18 | 27 | −57 | −3 | −21 | 39 | −21 | 54 |
| 2 | −3 | 60 | −9 | 0 | −12 | 51 | −18 | −6 |
| 1 | 0 | 0 | 0 | 0 | 0 | 0 | 0 | 0 |

*Very large offsets

Theoretically, it can be shown that a reduction in the threshold voltage of a MOSFET injection input structure can be effected by feedback techniques. However, because the relative offset voltage between any pair of injection inputs is unknown, it appears that a feedback arrangement may be required for each injection input of a CCD array. A desirable feedback arrangement may be one in which the threshold voltage of the injection input is compensated in such a manner as to substantially remove its effects on the operation of a detector coupled thereto. And further, if such an input structure could be characterized to have low noise, low power and be capable of operating at cryogenic temperatures, it could be suitable for the majority of analog signal processing applications employing CCD's. Such a feedback compensation is described herein in connection with the present invention.

SUMMARY OF THE INVENTION

In accordance with the present invention, a semiconductor structure comprised of two field effect transistors cooperatively functioning in a feedback circuit arrangement is provided to reduce the effective threshold voltage of one of said field effect transistors as reflected to an electrical signal source which may be coupled thereto. More specifically, the semiconductor structure comprises a first conductivity type field effect transistor having source and drain regions residing at the surface of an epitaxial layer of a second conductivity type and a second conductivity type field effect transistor having a source and drain region of a higher concentration of impurities than said epitaxial layer being sandwiched between said epitaxial layer and a substrate layer of a first conductivity type. The source and drain regions of the first and second field effect transistors are aligned such that their respective surface and buried conduction channels and associated depletion regions are controlled by a voltage potential applied to a common gate contact. The voltage which is applied to the common gate contact affects the first and second depletion regions respectively associated with said surface and buried channel field effect transistors and renders a quiescent threshold voltage at the source region of the surface channel field effect transistor, said threshold voltage being reflected to the electrical signal source coupled to said source region. In conjunction with the gate voltage potential, another voltage potential is applied across the epitaxial and substrate layers to effect a relationship between the first and second depletion regions such that the pinch-off voltage of the buried channel field effect transistor is substantially equal to the quiescent threshold voltage of the surface channel field effect transistor. Accordingly, any charge flowing in the surface conduction channel screens the effects of the electric field lines produced by the gate voltage potential causing modulation of the first depletion region. Modulation of the first depletion region affects current in the buried conduction channel, said current being a function of the charge flow in the surface conduction channel. A feedback circuit means is provided to sense the current flowing in the buried channel and control the voltage applied to the common gate contact with such a phase relationship so as to substantially reduce the current flowing in the buried channel by maintaining the initially adjusted relationship between the first and second depletion regions, thereby substantially sustaining the quiescent threshold voltage.

DESCRIPTION OF THE PREFERRED EMBODIMENT

Figure 1:
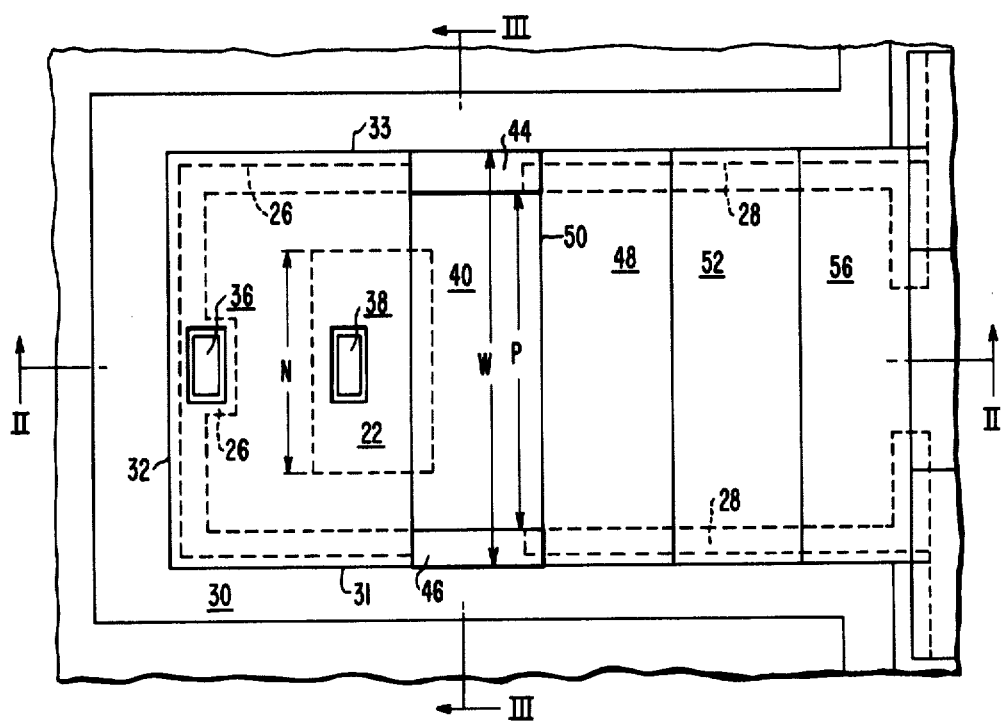
FIGS. 1, 2 and 3 depict top, side and profile view of an input injection structure of a charge coupled device illustrating the principles of the present invention.
Figure 2:
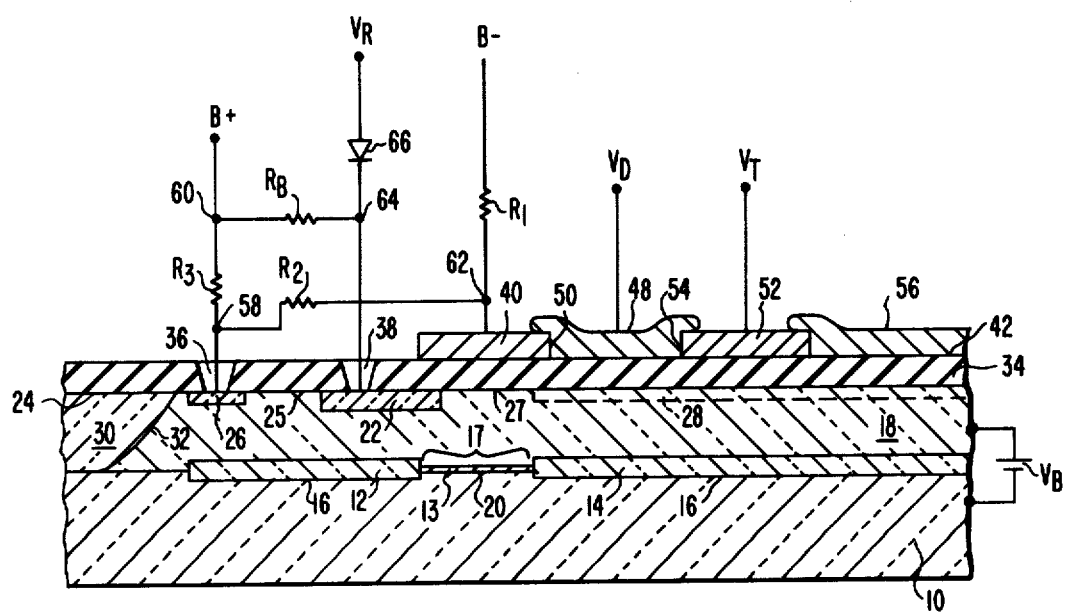
Figure 3:
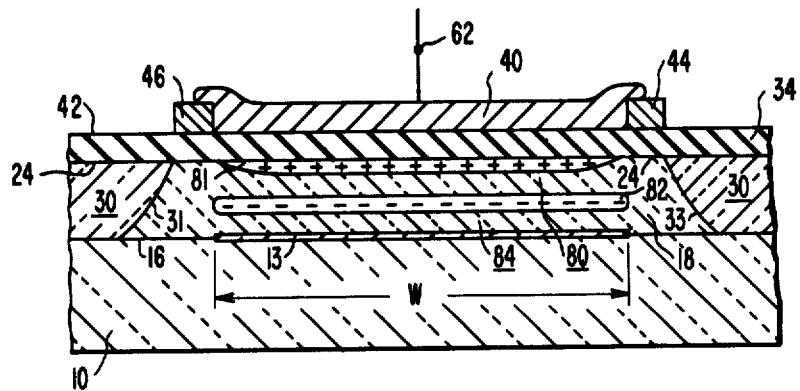

Top, side and profile views of a compensated input injection structure as applied to a charge coupled device (CCD) input are shown in FIGS. 1, 2 and 3, respectively. The side view of FIG. 2 exhibits the cross-section of the input injection structure along the approximately centered lines II—II of the top view depicted in FIG. 1. In addition, the profile view of FIG. 3 shows the cross-section of the CDI structure along the lines III—III of the top view depicted in FIG. 1. A silicon material 10 is doped with p-type impurities and is provided as a substrate for the input injection semiconductor structure for the purposes of this embodiment. Two sub-diffusion regions 12 and 14 of n+-type semiconductor material may be disposed on a surface 16 of the p-type silicon substrate 10. The n+ sub-diffusions 12 and 14 are considerably thinner in relation to the thickness of the silicon substrate 10 and both extend approximately a given distance P across the width of the CDI structure as measured in a direction which is parallel to the cross-sectional line III—III as shown in FIGS. 1 and 3. In addition, the n+ sub-diffusions 12 and 14 are separated along the entire width P by a window 17 as shown in FIG. 2 in relation to the cross-sectional line II—II. An ion implanted region 13 of n-type material may be disposed along the surface 16 within the window 17. An epitaxial layer 18 made of an n-type semiconductor material covers both the n+ sub-diffusion regions 12 and 14, the ion implanted region 13 and a portion of the silicon substrate 10. A p-n junction 20 is formed between the n-type epitaxial layer 18 and the p-type silicon substrate 10 along the surface 16 of the substrate 10 designated by the window separation 17. The n+ sub-diffusions 12 and 14 appear as two islands which are sandwiched between the n-type epitaxial layer 18 and p-type substrate 10 and separated longitudinally along their width P by the window 17 which has disposed therein the ion implanted region 13 of n-type material.

A diffusion region 22 of p+-type semiconductor material is located in the surface 24 of the epitaxial layer 18 which is opposite the surface which is covering the n+ sub-diffusions 12 and 14 and substrate 10. The diffusion region 22 may be aligned in relation to the n+ sub-diffusion layer 12 such that substantial portions of a virtual image of the periphery of region 22 may be perpendicularly projected onto region 12. Region 22 is physically separated from region 12 by the n-type epitaxial layer 18. The diffusion region 22 also may extend a distance N (less than P) over the surface 24 longitudinally measured parallel to the section line III—III and being transversely centered about the section line II—II. An n+ semiconductor diffusion region 26 may also be disposed in the surface 24 of the epitaxial layer 18 positioned approximately over a substantial portion of the outer periphery of the n+ sub-diffusion 12 and in some cases separated therefrom by the epitaxial layer 18. Another n+-type semiconductor diffusion region 28 is positioned in the surface 24 of the n-type epitaxial layer 18 over a substantial portion of the outer periphery of the n+-sub-diffusion 16 and, in some cases, separated therefrom by the epitaxial layer 18. The n+ surface diffusions 26 and 28 are separated from the p+ diffusion 22 to form exposed portions 25 and 27 on the n-type epitaxial layer 18 along the surface 24. An isolation diffusion 30 of p+-type semiconductor material may be disposed along the outer periphery of the n+ surface diffusions 26 and 28 denoted by the sides 31, 32 and 33 and physically isolated therefrom as shown in FIGS. 1, 2 and 3. The depth of the p+ isolation diffusion 30 may extend from the epitaxial layer surface 24 to the surface 16 of the substrate 10.

A layer of non-conductive material 34 which may be of an oxide compound, like silicon dioxide, covers the p+ and n+ diffusions 22 and 26, 28 respectively, and exposed portions 25 and 27 of the n-type epitaxial layer 18. A portion of the layer 34 which is directly over the n+ contact diffusion 26 is removed to form a window 36 in the layer 34 which exposes a portion of the surface of the n+ diffusion 26. Another portion of the layer 34 which is directly over the p-+ contact diffusion 22 is removed to form a window 38 in the layer 34 which exposes a portion of the surface of the p+ diffusion region 22.

A region of conductive material 40 is located on the exposed surface 42 of the non-conductive layer 34 and positioned such that a substantial portion of a virtual image of its area may be perpendicularly projected onto the window area 17. The conductive material 40 extends a width P along the sectional line III—III approximately centered about and transverse to the sectional line II—II as shown in FIG. 1. On both sides of the conductive region 40 in parallel relation to the sectional line II—II may be adjacently located two regions of material 44 and 46 commonly referred to in the pertinent art as field shields which are not in electrical contact with region 40. Another region of conductive material 48 is positioned on the surface 42 adjacent to the conductive region 40 and extending approximately a width W in parallel relation to the sectional line III—III centered about and transverse to the sectional line II—II. The conductive material 48 is electrically isolated from the conductive material 40 by locating a non-conductive material therebetween at the interface 50. Another region of conductive material 52 is positioned on the surface 42 adjacent to the conductive region 48 in a parallel relation with respect to the plane of the cross-section III—III. Another interface 54 is disposed between conductive regions 52 and 48 to render electrical isolation in a similar manner as that of the interface 50. Additional conductive regions 56 may be arranged adjacently on the surface 42 analogous to the arrangement of the conductive regions 40, 48 and 52.

One end 58 of a resistor R3 may be electrically coupled to the exposed contact portion of the n+ diffusion 26 through the window 36 removed from the non-conductive layer 34. The other end 60 of resistor R3 may be electrically coupled to a B+ voltage supply potential. One end 62 of a resistor R1 may be electrically coupled to a gate contact comprising the conductive material region 40 and the other end may be coupled to a B− voltage supply potential. A resistor R2 may be electrically coupled to resistors R3 and R1 at the junctions 58 and 62, respectively. A cathode end of a photodiode 66, which may be used to exemplify a detector suitable for describing the operation of this preferred embodiment, is electrically coupled to the exposed surface of the p+ diffusion 22 through the window 38 removed from the non-conductive material layer 34. The anode end of the photodiode 66 is connected to a reference supply voltage $V_R$. Another resistor $R_B$ is electrically coupled between the B+ supply voltage and the cathode of the photodiode 66 at junction 64. A d.c. electrical potential $V_D$ may be coupled to the conductive region 48 and should have a conventional magnitude and potential with respect to the potential applied to source junction 64. A charge transfer control signal $V_T$ is coupled to the conductive region 52 to conventionally control the input of charge to a charge coupled device cell.

The input injection structure described hereinabove in connection with FIGS. 1, 2 and 3 is comprised essentially of two metal oxide semiconductor field effect transistors (MOSFETs). An enhancement mode p-channel MOSFET T2 is formed by the p+ diffusion region 22 which constitutes a source, the conductive region 40 which constitutes a gate, and a virtual drain region which may be induced in the epitaxial region 18 just below the conductive region 48 by applying an appropriate bias voltage potential to the region 48 being used as the drain contact of the MOSFET T2. The second MOSFET T1, which is an n-channel depletion mode device, is formed by the n+ sub-diffusions 12 and 14 which constitute the drain and source regions thereof, respectively. A common gate contact 40 is utilized by both MOSFETs T1 and T2. The n+ region 26 is used as the drain contact for the MOSFET T1. Depletion regions 80 and 84 are formed in a region of the epitaxial layer 18 approximately below the gate contact 40.

The depletion regions 80 and 84 surround the buried channel 82 overlapping the areas substantially under field shields 46 and 44. These depletion regions 80 and 84 are formed and contained by a combination of effects resulting from a potential applied to the p+ semiconductor isolation region 30 in conjunction with the potentials applied to the field shields 44 and 46, the epilayer 18 and the gate contact 40. The n+ regions 12 and 14 and n-type ion implanted region 13 render additional contributions to isolation and containment of the depletion regions 80 and 84. The concentration of the n impurities in the region 13 may be tailored to achieve an electrically neutral region at the episurface regions 27 located under field shields 44 and 46 as well as a depletion region 84 in relation to the surface 16.

A conduction channel 81 of the MOSFET T2 may be formed at the surface 24 of the epitaxial layer 18 sandwiched between the depletion region 80 and insulator region 34 under gate contact 40. A conduction channel 82 of the MOSFET T1 may be formed between the depletion regions 80 and 84. Both conduction channels 81 and 82 are also contained and isolated by the depletion regions developed with the field shields 44 and 46 in cooperation with the potentials of the surface gate 40 and the bias $V_B$. A back-bias voltage potential $V_B$ may be applied across the epitaxial layer 18 and the p-substrate 10 to initially adjust the depletion region 84 with respect to the depletion region 80 to set the pinch-off voltage $V_{PO}$ of the n-channel MOSFET T1 equal to the threshold voltage $V_{TH}$ of the p-channel MOSFET T2, the reasons for this initial adjustment will be clearer from a more detailed description found herebelow.

Figure 4:
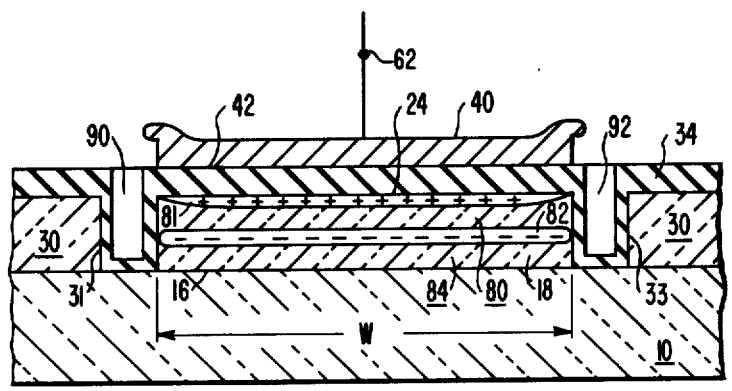
FIG. 4 depicts a profile view of an alternative embodiment related to the embodiments shown in the views of FIGS. 1 and 2.

An alternative embodiment which may also be used to isolate and contain edges or sides of the conduction channels 81 and 82 in a region within the epitaxial layer approximately below the gate contact 40 as shown in FIG. 4. Referring to FIG. 4, the field shields 44 and 46 and the ion implanted region 13 are removed from the embodiment depicted in FIGS. 1, 2 and 3. Portions 90 and 92 of the n-type epitaxial layer 18 are shown extracted primarily in the regions approximately below the area of the surface 24 where the field shields 44 and 46 had been depicted in FIG. 3. In fabrication, the oxide layer 34 may be grown to contour the extracted regions 90 and 92 of the epitaxial layer 18. It is expected that removal of the epitaxial layer 18 in the regions 90 and 92 will offer similar electrical containment and isolation of the edges or sides of the conduction channels as that provided by the embodiment described in connection with FIGS. 1, 2 and 3.

Figure 5:
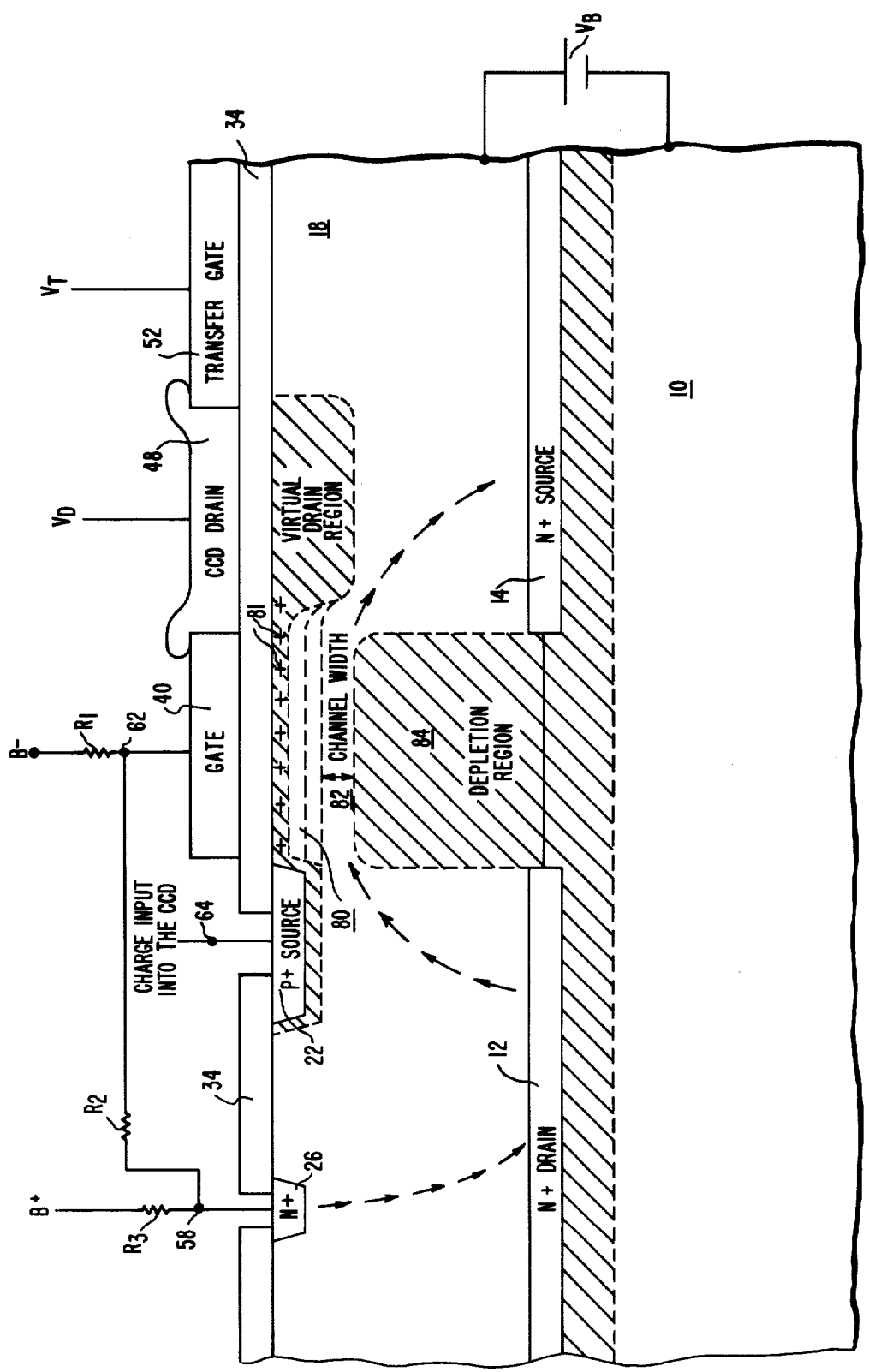
FIG. 5 shows a modified side view of the embodiment depicted in FIGS. 1, 2 and 3.

In either of the embodiments described above, an equivalence between $V_{PO}$ and $V_{TH}$ may be realized because both MOSFET's T1 and T2 have a common gate being the conductive layer 40 and because the effective thickness of the n-type epitaxial layer 18 may be made less than the depletion width possible with the common gate 40. These conditions may be better appreciated if the conditions necessary to realize channel pinch-off and threshold voltage are examined. Referring to a modified side view of the input injection structure as shown in FIG. 5, the depletion region 80 under the p-channel MOSFET T2 is modulated by the screening effects of the charge flowing through the channel 81 located under the gate contact 40 on the electric field produced by the voltage potential applied to the gate contact 40. The conduction channel 82 of the n-channel MOSFET T1 is modulated in a 180° phase relationship in accordance with the modulation of the width of the depletion region 80. A back bias potential $V_B$ is applied across the n-type epitaxial layer 18 and the p-type silicon substrate 10 such that the epitaxial layer 18 is at a positive potential with respect to the substrate 10 (see FIG. 2). As a result, the depletion region 84 formed by the back bias potential $V_B$ may be adjusted to merge with the depletion region 80 formed by the potential at junction 62 applied to the common gate 40 such that the threshold voltage $V_{TH}$ for the p-channel MOSFET T2 may occur when the conduction channel 82 of the MOSFET T1 is pinched off (i.e., substantially no current 86 is flowing through the channel 82). Under these conditions then, the threshold voltage $V_{TH}$ is adjusted to substantially equal the pinch-off voltage $V_{PO}$.

A primary characteristic of the input injection structure as depicted in FIGS. 1 through 5 is the effect of the surface charge flowing in the channel 81 under the input injection gate 40 and the modulation width of the depletion region 80 as affected by this surface charge. The charge flowing in the surface channel 81 screens the effect of the electric field lines produced by the voltage applied to the input injection gate 40, thereby decreasing the width of the depletion region 80. Changes in the depletion width 80 produced by the surface charge 81 causes a modulation of the channel width 82 of the depletion mode MOSFET T1 and in turn the current 86 flowing therein as shown in FIG. 5. The effective screening of the electric field lines can be functionally related to the charge flowing in the surface channel.

An equivalent circuit for the input injection structure depicted in FIGS. 1, 2, 3 and 4 may be obtained if all the input injection characteristics described in reviewing the input injection structure are incorporated. Consider the equivalent circuit shown in FIG. 6. Two MOSFET's T1 and T2 are connected by a network of resistors R1, R2 and R3 and their gates are coupled together. Device T1 is the n-channel depletion mode MOSFET and T2 is the p-channel enhancement mode MOSFET. In this equivalent configuration, it is assumed that the threshold voltage, $V_{TH}$, of MOSFET T2 has been preset substantially equal to the pinch-off voltage, $V_{PO}$, of the MOSFET T1 by appropriately adjusting the back bias potential $V_B$ which is applied across the epitaxial layer 18 and substrate 10. This equivalence is an important condition to be satisfied for compensation of threshold variations in the direct injection input to the CCD.

Without loss of generality, it is assumed that the quiescent dc voltage developed on the common gate 40 at junction 62 by the resistor network R3, R1, and R2 in combination with the B+ and B− power supplies is initially zero. The threshold voltage $V_{TH}$ and pinch-off voltage $V_{PO}$ have been exhibited as voltage sources in series with the gates of T2 and T1, respectively. Such equivalent representation is valid because in practice the pinch-off and threshold voltages behave like series voltage sources applied to a FET gate. The dc operation of the circuit depicted in FIG. 6 is established by the resistor network R1, R2 and R3 and a current I supplied in response to the operation of detector 66 and conducted through the channel of the MOSFET T2 and a transconductance ($g_m$) characteristic of T2 which, in combination with I, produces a voltage source V(I) on the gate of T1 which is a function of the charge flowing in the channel 81.

Figure 6:
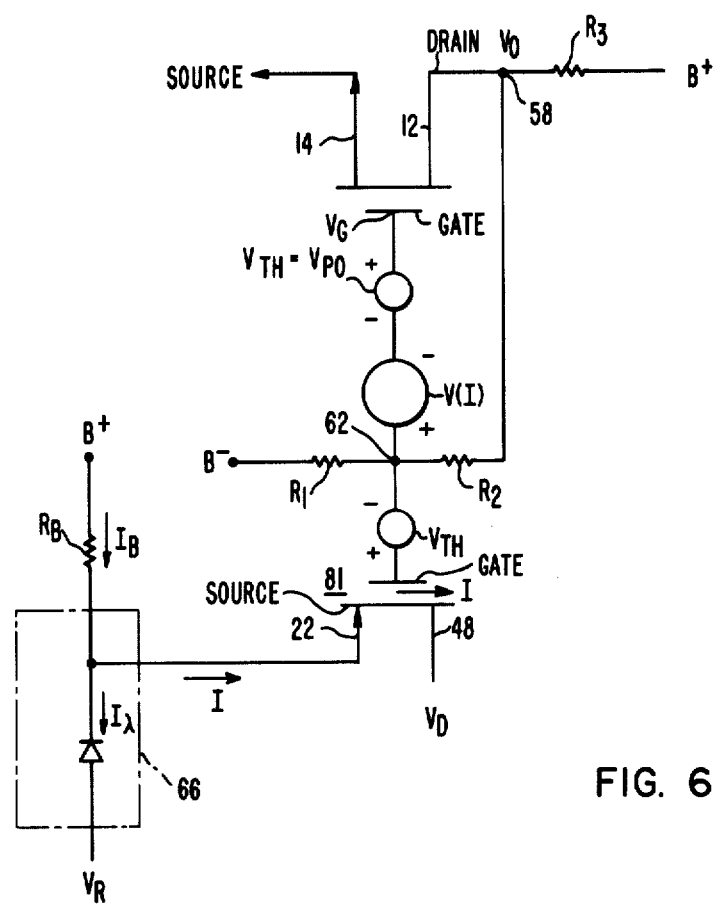
FIG. 6 shows an equivalent circuit for the input injection structure.

The ac benefits obtained with the dual field effect transistor structure can be explained with the analysis of the equivalent circuit of FIG. 6 containing the voltage source V(I). The voltage source V(I) is representative of the effects on the buried channel n-type depletion mode device T1 when current is flowing in the surface channel 81 (see FIG. 5). A change of the current I flowing in the surface channel 81 modulates the depletion width 80 under the common gate 40 and thus causes a complementary modulation of the channel width 82 which affects a current in the buried channel device T1. An increase in current 81 causes an increase in the current 86 which flows in the conduction channel 82 of the depletion mode device T1. A larger current 86 causes an increase in voltage differential across resistor R3 which affects a decrease in the voltage $V_o$ at junction 58. As the voltage $V_o$ decreases, the voltage applied to the gate 40 at junction 62 likewise decreases as a result of the resistor divider network R1 and R2 coupled between junction 58 and B−. A decrease in the voltage at the gate 40 affects an increase in the depletion width 82 thereby substantially returning the value of current 86 to the value existing before the increase in current I. This response is accounted for by the equivalent voltage source V(I) in series with a gate of the depletion mode device T1. The polarity and magnitude of the change in voltage source V(I) is in such a direction as to substantially reduce the current 86 conducted through channel 82. Thus, the phase relation between the output voltage ($V_o$) at junction 58 of T1 and the source produced by current I at the source 22 of T2 is 180 degrees. Such behavior will make the source 22 of T2 more accommodating to receiving higher frequency currents.

The dc operations of the dual field effect transistor structure can be analyzed with the equivalent circuit shown in FIG. 6. The voltage $V_G$ of the gate of MOSFET T1 may be considered as being dependent on three terms: the output feedback voltage $V_o$, the pinch-off voltage $V_{PO}$ and the voltage source V(I) which is a function of the current I conducted through channel 80 of MOSFET T2. The $V_{TH}$ voltage has been included in the equivalent circuit of FIG. 6 as a separate voltage generator, thus the gate voltage $V_G$ calculated reflects the total threshold variations associated with T2. Consequently, it can be shown that the gate voltage $V_G$ may be approximated by the expression:

$$\frac{V_{TH}(1 + \Delta)}{1 + A/2,}$$

where A is the open loop gain of T1, $V_{TH}$ is the threshold voltage of T2 which is substantially equal to the pinch-off voltage $V_{PO}$ of T1 and $\Delta$ accounts for error fluctuations in the approximation. Assuming that the term $V_{TH}$ may comprise a mean term $\overline{V}_{TH}$ and an incremental variation of $\Delta V_{TH}$ and that the approximation may not vary greater than ±10%, an effective threshold reduction may be evaluated for typical operating parameters. The open loop gain A of MOSFET T1 at cryogenic termperatures may be typically 60. (The increased mobility at cryogenic temperatures may account for the larger gain.) Substituting an appropriate set of values for the mean and incremental variations of the threshold voltage (see Table 1), the open loop gain A and the percentage variation Δ, the following result is afforded:

$$\Delta V_G = \frac{125\ mV + 270\ mV}{31}(1 + .1) = 14\ mV.$$

It is shown, then, that the threshold voltage variations of the conventional direct injection structures as described in the Background section found hereinabove may be reduced, in general, by an order of magnitude as a result of the compensated direct injection structure described above.

Figure 7:
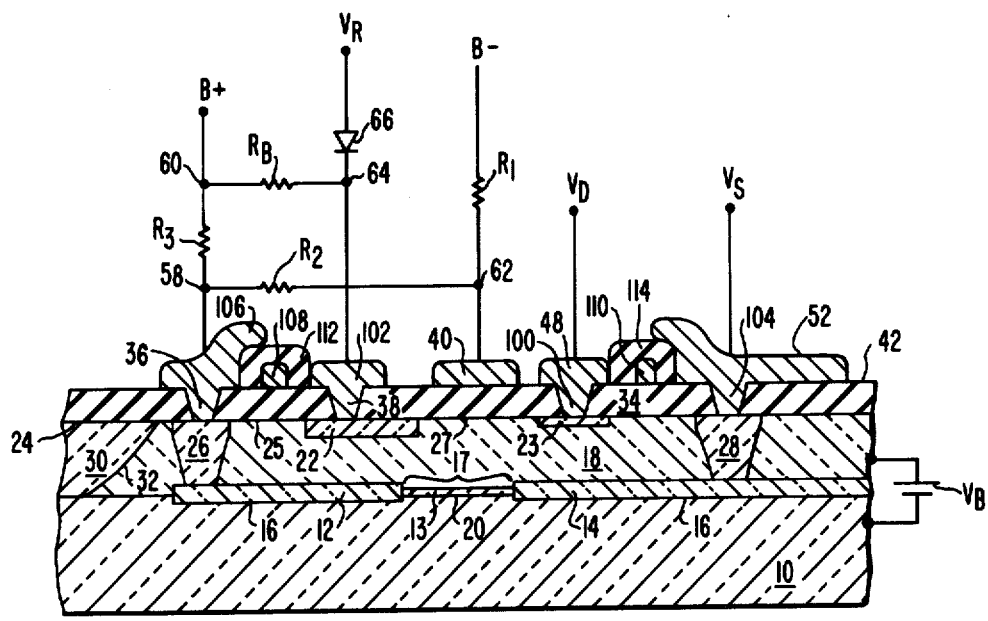
FIG. 7 depicts a side view of an embodiment of a charge coupled field effect transistor which is also used to illustrate the principles of the invention.

While the principles of the invention have been described in connection with the embodiments of FIGS. 1 through 4 which are depicted in the context of a compensated injection input structure for a charge coupled device, these same principles may similarly be described in connection with an embodiment of a charge coupled field effect transistor as shown in FIG. 7. The structure exhibited in FIG. 7 is suitable for use as an amplifier, for example, independent of any charge coupled device input. The embodiment of FIG. 7 will be described in relation to the embodiment as shown in FIG. 1. A second p+-type semiconductor region 23 is disposed on the surface 24 of the epitaxial layer 18. This region 23 constitutes a real drain region for the p-type enhancement mode MOSFET device T2. A window opening 100 is made in the non-conductive layer 34 to expose a portion of the p+-type semiconductor region 23. The conductive region 48 is disposed in the window opening 100 to make contact with the real drain region 23. A conductive region 102 is disposed in the window region 38 to provide contact with the source region 22 of the enhancement mode device T2. The source contact 102 is equivalently coupled to junction 64 (see FIG. 2) and the drain contact 48 is coupled to a bias voltage potential $V_D$.

The n+-type semiconductor 28 is extended in the epitaxial layer 18 to be aligned under the conductive region 52. A window opening 104 is provided through the non-conductive layer 34 to permit contact between the region 28 and the conductive region 52. The portion of the region 28 under the contact 52 may extend through the epitaxial layer 18 to make contact with the source region 14 of the depletion mode device T1. The source contact 52 may be coupled to a bias voltage potential $V_S$. Further, the portion of the region 26 below the window opening 36 may be extended in the epitaxial layer 18 to make contact with the drain region 12 of the depletion mode device T1. A region of conductive material 106 may be disposed in the window opening 36 to provide electrical contact between junction 58 and source contact region 26.

Field shields 108 and 110 are disposed on the surface 42 of the non-conductive layer 34 between the conductive regions 106 and 102 and the conductive regions 48 and 52, respectively. A layer of non-conductive material 112 covers the exposed surfaces of the field shield 108 and electrically isolates it from the conductive regions 102 and 106. Likewise, a layer of non-conductive material 114 covers the exposed surface of the field shield 110 and electrically isolates it from the conductive regions 48 and 52.

The operation of the structure shown in FIG. 7 is similar to that described for the compensated injection structures of FIGS. 1 through 6 with the exception that the charge flowing in the conduction channel of the surface enhancement mode device T2 may be electrically coupled to any device connected to contact 48 which has the appropriate bias voltage rather than transferred to an input cell of a charge coupled device. Experiments have shown that an a.c. current flowing in the overlying p-channel will modulate the current flowing in the underlying n-channel even though the surface and back gates are at d.c. voltages. This modulation occurs because the surface current, flowing traverse to the surface gates field lines, screens the surface gate's field lines thereby modulating the depletion region which controls the thickness of the underlying channel (see FIG. 5). Changing the d.c. reverse bias voltage $V_B$ between the epitaxial layer 18 and substrate 10 may vary the coupling function V(I) between the enhancement and depletion mode devices (see FIG. 6).

I claim:

1. A compensated input injection structure for coupling the electrical information generated by a detector to a charge coupled device, said structure comprising:
   a substrate semiconductor layer of a first conductivity type;
   an epitaxial semiconductor layer of a second conductivity type having one surface contiguous with one surface of said substrate to form an interface therebetween;
   first and second regions of semiconductor material of a higher concentration of second conductivity type impurities than said epitaxial layer being sandwiched at the interface between said epitaxial and substrate layers and being separated from each other to constitute a drain and source, respectively, for a first type field effect transistor;
   a third semiconductor region of a higher concentration of first conductivity type impurities than said substrate layer being disposed in a first area of another surface of the epitaxial layer, which is opposite said one surface, said first area being aligned vertically over a portion of said first semiconductor region, which substantially borders a first portion of separation between said first and second semiconductor regions, said third semiconductor region constituting a source for a second type field effect transistor;
   a fourth semiconductor region of a similar concentration of second conductivity type impurities as said first and second regions being disposed in a second area of said another surface of the epitaxial layer, said second area being aligned vertically over another portion of said first semiconductor region, said fourth semiconductor region constituting a drain contact region for the first type field effect transistor;
   a layer of nonconductive material for covering said another surface of the epitaxial layer except for portions of said third and fourth semiconductor regions which are exposed through windows in said nonconductive layer;

a first region of conductive material being disposed on a third area of the exposed surface of said non-conductive layer, said third area being aligned vertically over at least the first portion of separation between said first and second semiconductor regions, said first conductive region constituting a common gate contact of both said first and second type field effect transistors;

a second region of conductive material being disposed on a fourth area of the exposed surface of said non-conductive layer, said fourth area being adjacent said third area and aligned vertically over a portion of said second semiconductor region which substantially borders the first portion of separation between said first and second semiconductor regions, said second conductive region being electrically isolated from said first conductive region and constituting a drain contact of said second type field effect transistor which is maintained at a bias voltage potential such that a virtual drain region may be formed in the epitaxial layer located vertically thereunder;

a third region of conductive material being disposed in a fifth area of the exposed surface of said non-conductive layer, said fifth area being adjacent said fourth area and aligned vertically over another portion of said second semiconductor region, said third conductive region being electrically isolated from said second region and constituting a contact for controlling the transfer of charge from said virtual drain region to the input of the charge coupled device;

a first means for applying a first voltage potential to said common gate contact, said first voltage potential affecting a depletion region and conduction channel associated with each of the first and second type field effect transistors to render a quiescent threshold voltage of the second type field effect transistor;

a second means for applying a second voltage potential across said epitaxial and substrate layers at a value which sets the pinch-off voltage of the first type field effect transistor substantially equal to the quiescent threshold voltage of said second type field effect transistor;

a third means for coupling said detector to the exposed portion of said third semiconductor region to render an amount of charge to flow in the conduction channel of said second field effect transistor, said amount of charge flow being representative of the electrical information generated by said detector in accordance with the threshold voltage reflected to said detector from said second field effect transistor;

a fourth means coupled to the exposed portion of said fourth semiconductor region and said first means for detecting said amount of charge flow in the conduction channel of said second field effect transistor and controlling the value of said first voltage potential applied to said common gate contact as a function of said detected amount of charge flow.

2. A structure in accordance with claim 1 wherein the first conductivity type semiconductor is comprised of p-type conductivity impurities and the second conductivity type semiconductor is comprised of n-type conductivity impurities.

3. A structure in accordance with claim 2 wherein the first type field effect transistor (FET) is an n-channel depletion mode FET and the second type FET is a p-channel enhancement mode FET.

4. A structure in accordance with claim 1 including a fifth means for isolating and containing the depletion regions and conduction channels of the first and second type field effect transistors in a section of the epitaxial layer which is substantially bounded on one side by the third area of the common gate contact and on the other side by the first portion of separation between said first and second semiconductor regions.

5. A structure in accordance with claim 1 wherein said structure further comprises:

a fifth semiconductor region having a similar concentration of impurities as said first and second semiconductor regions and being disposed at the other surface of the epitaxial layer vertically over an area of the second semiconductor region which substantially borders said second semiconductor region on both sides of said first separation portion;

a sixth semiconductor region having a similar concentration of impurities as said first and second semiconductor regions and being disposed at the another surface of the epitaxial layer vertically over an area of the first semiconductor region encompassing its periphery except for the border adjacent said first separation portion;

two field shields of conductive material disposed on the exposed surface of the non-conductive layer, each field shield being adjacent a side of the gate contact region which is vertically over an area of the substrate that borders the first separation portion not bordered by the first and second semiconductor regions;

a seventh semiconductor region having a similar concentration of impurities as said first and second semiconductor regions and thickness substantially thinner than said first and second semiconductor regions and being disposed on said first portion of separation of said substrate; and an eighth semiconductor region having a similar concentration of impurities as said third region disposed around the epitaxial layer encompassing the outside periphery of the areas related to the fifth and sixth semiconductor regions and the two field shields, said eithth semiconductor region being physically isolated from the fifth and sixth semiconductor regions and two field shields by portions of the epitaxial layer.

6. A structure in accordance with claim 4 wherein said fifth means comprises:

a fifth semiconductor region having a similar concentration of impurities as said first and second semiconductor regions and being disposed at the another surface of the epitaxial layer vertically over an area of the second semiconductor region which substantially borders said second semiconductor region on both sides of said first separation portion;

a sixth semiconductor region having a similar concentration of impurities as said first and second semiconductor regions and being disposed at the another surface of the epitaxial layer vertically over an area of the first semiconductor region encompassing its periphery except for the border adjacent said first separation portion;

wherein two sections of the epitaxial layer which are correspondingly aligned vertically over a predetermined area of the substrate on each side of the first portion of separation which is not bordered by either of the first and second semiconductor regions are extracted; and an eighth semiconductor region having a similar concentration of impurities as said third region disposed around the epitaxial layer encompassing the outside periphery of the areas related to the fifth and sixth semiconductor regions and said two extracted sections of epitaxial layer, said eighth semiconductor region being physically isolated from the fifth and sixth semiconductor regions by portions of the epitaxial layer.

7. A structure in accordance with claim 1 wherein the conduction channels and associated depletion regions of the first and second type field effect transistors are located in a section of the epitaxial layer which is substantially bounded by the area of another surface of the epitaxial layer under the common gate contact region and the area of the interface surface of the epitaxial layer designated by the first portion of separation between the first and second semiconductor regions;

wherein the first voltage potential applied to the gate contact region by the first means affects a first depletion region and surface conduction channel of the second type field effect transistor and a second depletion region and buried conduction channel of the first field effect transistor; and wherein the second voltage potential applied across the epitaxial and substrate layers in combination with the first voltage applied to the gate contact region causes a relationship between said first and second depletion regions which substantially pinches off the buried conduction channel of the first field effect transistor, thereby substantially equaling the pinch-off voltage of the first type field effect transistor to the threshold voltage of the second type field effect transistor.

8. A structure in accordance with claim 7 wherein the charge flow, which may be representative of the electrical information generated by the detector, is conducted through the surface conduction channel from the source region of the second type field effect transistor; wherein the first depletion region may be modulated in accordance with the amount of charge flow conducted through the surface conduction channel to alter the buried conduction channel region between the first and second depletion regions to provide a channel through which a first current may be conducted between the first and second semiconductor regions; and wherein the fourth means detects the first current and adjusts the first voltage potential at the gate conductor in a direction to provide a relationship between the first and second depletion regions which reduces the detected first current by pinching off the buried conduction channel.

9. A structure in accordance with claim 8 wherein the first and third means are comprised of a network of first, second and third resistors connected in series having a first junction between said first and second resistors and a second junction between said second and third resistors, said series resistor network having a first predetermined voltage potential applied at the first resistor end and a second predetermined voltage potential applied at the third resistor end, said first junction being coupled to the common gate contact of said first and second type field effect transistors and said second junction being coupled to said fourth region which constitutes a chain contact region for the first type field effect transistor; wherein the first current is reflected in a voltage drop across the third resistor resulting in a change in the voltage potential at said second junction which alters the voltage potential applied to the gate conductor utilizing the first and second resistor divider network, said voltage potential alteration being in a direction to reduce the first current.

10. A structure in accordance with claim 9 wherein the first conductivity type semiconductor is comprised of p-type conductivity impurities and the second conductivity type semiconductor is comprised of n-type conductivity impurities.

11. A structure in accordance with claim 10 wherein the first type field effect transistor (FET) is an n-channel depletion mode FET and the second type FET is a p-channel enhancement mode FET.

12. A structure in accordance with claim 11 wherein the first predetermined voltage potential is negative with respect to the second predetermined voltage potential.

13. A method for reducing the effects of the threshold voltage associated with a field effect transistor as reflected to a detector which is coupled thereto, said method comprising the steps of:

combining two field effect transistors of opposite conductivity types to have a common gate which may be used to control the depletion regions and conduction channels of both of said field effect transistors;

applying a voltage potential to said common gate to affect a first depletion region and conduction channel associated with one of said field effect transistors and a second depletion region and conduction channel associated with the other field effect transistor, said voltage potential rendering to a quiescent threshold voltage of said one field effect transistor which is reflected to said detector;

initially adjusting the second depletion region with respect to the first depletion region in an initial relationship which substantially equates the pinch-off voltage of the other of said field effect transistors to the quiescent threshold voltage of said one field effect transistor by substantially pinching off the current in the conduction channel of the other field effect transistor;

causing a charge to flow in the conduction channel of said one field effect transistor, said charge may be representative of the electrical information rendered by said detector;

effecting the initial relationship between the first and second depletion regions to permit current in the channel of the other field effect transistor as a function of said charge flow in the conduction channel of said one field effect transistor; and sensing said current in the conduction channel of the other field effect transistor and adjusting the value of the voltage potential applied to said common gate to substantially reduce the current in the channel of said other field effect transistor by maintaining the initially adjusted relationship between said first and second depletion regions to substantially sustain the quiescent threshold voltage of the one field effect transistor as reflected to the detector.

14. The method in accordance with claim 13 wherein the two field effect transistors are combined in a semiconductor structure having a substrate layer of a first conductivity type semiconductor interfaced with an epitaxial layer of a second conductivity type semiconductor, said step of combining including the steps of:

disposing the source and drain regions of the one field effect transistor on the exposed surface of said epitaxial layer;

sandwiching the source and drain regions of the other field effect transistor at the interface between said substrate and epitaxial layers;

aligning the common gate on the exposed surface of said epitaxial layer over a common portion of separation between the source and drain regions of both field effect transistors; and electrically insulating the common gate from said source and drain regions and epitaxial layer.

15. The method in accordance with claim 14 wherein the initial relationship between the first and second depletion regions is adjusted by applying a predetermined voltage potential across the epitaxial and substrate layers.

16. The method in accordance with claim 13 wherein the steps of sensing the current and adjusting the value of the voltage potential applied to the common gate includes the steps of:

forming a circuit network coupling the two field effect transistors by connecting one junction of a series network of resistors to the drain region of the other field effect transistor, connecting another junction of said series resistor network to the common gate, and applying a predetermined voltage potential across said series resistor network;

affecting a voltage change at said one junction as a function of the current in the conduction channel of the other field effect transistor which proportionally alters the voltage at said other junction which is connected to the common gate; and reestablishing the initial relationship between the first and second depletion regions as governed by the altered voltage applied to the common gate from said other junction of said series resistor network.

17. The method in accordance with claim 13 wherein the step of effecting the initial relationship between the first and second depletion regions includes the steps of:

producing electric field lines in at least the first depletion region as a function of the value of the voltage potential applied to the common gate;

screening said electric field lines from the first depletion region with the charge flowing in the conduction channel of the one field effect transistor;

modulating the first depletion region with respect to the second depletion region in response to said screening of said electric field lines; and causing current in the conduction channel of the other field effect transistor as a result of said modulation of the first depletion region.

18. A compensated field effect transistor structure for reducing the effects of a threshold voltage thereof as reflected to a detector coupled thereto, said structure comprising:

a substrate semiconductor layer of a first conductivity type;

an epitaxial semiconductor layer of a second conductivity type having one surface contiguous with one surface of said substrate to form an interface therebetween;

first and second regions of semiconductor material of a higher concentration of said conductivity type impurities than said epitaxial layer being sandwiched at the interface between said epitaxial and substrate layers and being separated from each other to constitute a drain and source respectively, for a first type field effect transistor;

third and fourth semiconductor regions of a higher concentration of first conductivity type impurities than said substrate layer being respectively disposed in first and second exclusive areas of another surface of the epitaxial layer, which is opposite said one surface, said first and second areas being respectively aligned vertically over a portion of said first and second semiconductor regions, which substantially borders a first portion of operation between said first and second regions, said third and fourth semiconductor regions constituting a source and drain, respectively, for a second type field effect transistor;

fifth and sixth semiconductor regions of a similar concentration of second conductivity type impurities as said first and second regions being disposed in third and fourth areas of said another surface of said epitaxial layer and extending through said epitaxial layer to make electrical contact with said first and second regions, respectively, said fifth and sixth semiconductor regions constituting drain and source contacts, respectively, for the first type field effect transistor;

a layer of non-conductive material for covering said another surface of the epitaxial layer except for portions of said third, fourth, fifth and sixth semiconductor regions which are exposed through windows in said non-conductive layer;

a first region of conductive material being disposed on a fifth area of the exposed surface of said non-conductive layer, said fifth area being aligned vertically over at least the first portion of separation between said first and second semiconductor regions, said first conductive region constituting a common gate contact of both said first and secnd type field effect transistors;

second and third regions of conductive material being respectively disposed in the windows in said non-conductive material which expose said third and fourth regions to make electrical contact therewith, said second and third conductive regions constituting source and drain contacts, respectively, for the second type field effect transistor, said fourth conductive region being maintained at a first bias voltage potential;

a fourth and fifth regions of conductive material being respectively disposed in the windows of said non-conductive material which expose said fifth and sixth semiconductor regions to make electrical contact therewith, said fourth and fifth conductive regions constituting drain and source contacts, respectively for the first type field effect transistor, said sixth conductive region being maintained at a second bias voltage potential;

a first means for applying a first voltage potential to said common gate contact, said first voltage potential affecting a depletion region and conduction channel associated with each of the first and second type field effect transistors to render a quiescent threshold voltage of the second type effect transistor;

a second means for applying a second voltage potential across said epitaxial and substrate layers at a value which sets the pinch-off voltage of the first type field effect transistor substantially equated to the quiescent threshold voltage of said second type field effect transistor;

a third means for coupling said detector to the exposed portion of said third conductive region to render an amount of charge to flow in the conduction channel of said second field effect transistor formed by said first voltage potential applied to said common gate contact, said amount of charge flow being representative of the electrical information generated by said detector in accordance with the threshold voltage reflected to said detector from said second field effect transistor; and a fourth means coupled to said fourth conductive region and said first means for detecting said amount of charge flow in the conduction channel of said second field effect transistor and controlling the value of said first voltage potential applied to said common gate contact as a function of said detected amount of charge flow to substantially maintain the quiescent threshold voltage of the second type field effect transistor, thereby reducing its effects on the detector.

19. A structure in accordance with claim 18 wherein the first conductivity type semiconductor is comprised of p-type conductivity impurities and the second conductivity type semiconductor is comprised of n-type conductivity impurities.

20. A structure in accordance with claim 18 wherein the first type field effect transistor (FET) is an n-channel depletion mode FET and the second type FET is a p-channel enhancement mode FET.

21. A structure in accordance with claim 18 including a fifth means for isolating and containing the depletion regions and conduction channels of the first and second type field effect transistors in a section of the epitaxial layer which is substantially bounded on one side by the third area of the common gate contact and on the other side by the first portion of separation between said first and second semiconductor regions.

22. A structure in accordance with claim 18 wherein the conduction channels and associated depletion regions of the first and second type field effect transistors are located in a section of the epitaxial layer which is substantially bounded by the area of another surface of the epitaxial layer under the common gate contact region and the area of the interface surface of the epitaxial layer designated by the first portion of separation between the first and second semiconductor regions;

wherein the first voltage potential applied to the gate contact region by the first means affects a first depletion region and surface conduction channel of the second type field effect transistor and a second depletion region and buried conduction channel of the first field effect transistor; and wherein the second voltage potential applied across the epitaxial and substrate layers in combination with the first voltage applied to the gate contact region causes a relationship between said first and second depletion regions which substantially pinches off the buried conduction channel of the first field effect transistor, thereby substantially equating the pinch-off voltage of the first type field effect transistor to the threshold voltage of the second type field effect transistor.

23. A structure in accordance with claim 22 wherein the charge flow which may be representative of the electrical information generated by the detector is conducted through the surface conduction channel from the source region of the second type field effect transistor; wherein the first depletion region may be modulated in accordance with the amount of charge flow conducted through the surface conduction channel to alter the buried conduction channel region between the first and second depletion regions to provide a channel through which a first current may be conducted between the first and second semiconductor regions; and wherein the fourth means detects the first current and adjusts the first voltage potential at the gate conductor in a direction to provide a relationship between the first and second depletion regions which reduces the detected first current by pinching off the buried conduction channel.

24. A structure in accordance with claim 23 wherein the first and third means are comprised of a network of first, second and third resistors connected in series having a first junction between said first and second resistors and a second junction between said second and third resistors, said series resistor network having a first predetermined voltage potential applied at the first resistor end and a second predetermined voltage potential applied at the third resistor end, said first junction being coupled to the common gate contact of said first and second type field effect transistors and said second junction being coupled to said fourth conductive region which constitutes a drain contact region for the first type field effect transistor; wherein the first current is reflected in a voltage drop across the third resistor resulting in a change in the voltage potential at said second junction which alters the voltage potential applied to the gate conductor utilizing the first and second resistor divider network, said voltage potential alteration being in a direction to reduce the first current.

25. A structure in accordance with claim 24 wherein the first conductivity type semiconductor is comprised of p-type conductivity impurities and the second conductivity type semiconductor is comprised of n-type conductivity impurities.

26. A structure in accordance with claim 25 wherein the first type field effect transistor (FET) is an n-channel depletion mode FET and the second type FET is a p-channel enhancement mode FET.

27. A structure in accordance with claim 26, wherein the first predetermined voltage potential is negative with respect to the second predetermined voltage potential.

* * * * *